United States Patent [19]

Martinez

[11] Patent Number: 4,760,290
[45] Date of Patent: Jul. 26, 1988

[54] SYNCHRONOUS LOGIC ARRAY CIRCUIT WITH DUMMY SIGNAL LINES FOR CONTROLLING "AND" ARRAY OUTPUT

[75] Inventor: Antonio M. Martinez, Fremont, Calif.

[73] Assignee: VLSI Technology, Inc., San Jose, Calif.

[21] Appl. No.: 53,071

[22] Filed: May 21, 1987

[51] Int. Cl.[4] .................. H03K 19/177; H03K 17/284
[52] U.S. Cl. ...................................... 307/465; 307/443; 307/469; 307/481; 307/269; 307/594; 307/606
[58] Field of Search ................. 307/443, 465, 468–469, 307/481, 581, 269, 592, 594–597, 602–603, 605–606; 364/716

[56] References Cited

U.S. PATENT DOCUMENTS

| | | | |
|---|---|---|---|
| 4,611,133 | 9/1986 | Peterson et al. ................. | 307/469 X |
| 4,668,880 | 5/1987 | Shoji ................................... | 307/469 |
| 4,687,959 | 8/1987 | Eitrheim et al. .................... | 307/465 |
| 4,692,637 | 9/1987 | Shoji ................................... | 307/481 X |
| 4,697,105 | 9/1987 | Moy ................................... | 307/469 X |
| 4,700,088 | 10/1987 | Tubbs .............................. | 307/481 X |

Primary Examiner—Stanley D. Miller
Assistant Examiner—D. R. Hudspeth
Attorney, Agent, or Firm—Ronald L. Yin

[57] ABSTRACT

In the present invention, an improved synchronous PLA circuit is disclosed. The PLA circuit is responsive to a single clock cycle. The PLA circuit has no internal or output glitches. Further, the PLA circuit uses less power since there are no internal or output glitches. The PLA circuit requires less area since metal lines do not have to carry as much power and do not have to be as wide as the prior art PLA circuits. Since less power is used, long term reliability is improved due to reduced heating stress and reduced current density stress (metal electromigration, etc.). The PLA circuit consists of two logic arrays and four dummy signal delay lines. When a clock signal gates the input signals into the logic array, it also simultaneously generates a dummy signal. The dummy signal propagates through adjacent dummy signal delay lines that parallel each logic array dimension and match the longest or worst case, delay through the logic array. Said delay lines having a plurality of interconnected single transistors with the number of transistors in each respective delay line being equal to the maximum number of transistors in each respective internal array for each respective dimension. Upon the dummy signals arriving at specific locations, control signals are generated which gate the output from each logic array.

11 Claims, 5 Drawing Sheets

SYNCHRONOUS LOGIC ARRAY CIRCUIT WITH DUMMY SIGNAL LINES FOR CONTROLLING "AND" ARRAY OUTPUT

TECHNICAL VIEW

The present invention relates to a synchronous logic array circuit, and more particularly, to an improved synchronous logic array circuit which is responsive to a single clock cycle.

BACKGROUND OF THE INVENTION

Synchronous logic array circuits are well known in the art. Typically, they are known as programmable logic arrays or PLA's. A PLA is typically a logic array circuit comprising two arrays of logic gates: a first array of AND gates and a second array of OR gates. The PLA is adapted to receive a plurality of input signals into the first array. From the first array of AND gates, the output signals are then passed to a buffer, typically called a minterm buffer. From the minterm buffer, the signals are received as input to the second array of OR gates. From the second array of OR gates, the output signal of the second array is passed to an output buffer which provides the output of the PLA.

In a synchronous PLA, the action of inputting the signal into the first array, the output of the signal from the first array into the minterm buffer, the input of the signal from the minterm buffer into the second array, and the output of the signal from the second array into the output buffer are all controlled by a clock signal. Heretofore, in the prior art, a synchronous PLA of the type just described functions by inputting the input signal into the first array upon the falling edge of a clock, and by the input of the input signal from the minterm buffer into the second array upon the rising edge of a clock. Thus, a synchronous PLA of the prior art has required two clock phases: a falling edge clock phase and a rising edge clock.

A further problem with the synchronous PLA of the prior art is that the minterm buffer and the output buffer must switch state for every clock cycle. Therefore, the current must flow from the power lines through each of the transistors in the minterm buffer or the output buffer. Since there are many transistors that switch, the metal power supply line that supplies the power must be wide to accommodate the large current. This has required a wide metal supply line or the pitch of the supply line must be big.

Finally, there are problems with glitches of the synchronous PLA's of the prior art. A glitch is an undesirable dip in the output from the output buffer and the minterm buffer of the synchronous PLA caused by the delayed discharging of the OR array and AND array respectively. Thus, the effect of the synchronous PLA of the prior art is that for both minterm buffers and output buffers, there is higher current, accompanied by increased power consumption, with glitches in the output.

In the prior art, a dummy line for a RAM/ROM array is also known. When a particular word line (a particular row) of a RAM/ROM array is addressed, that word line being activated also activates a transistor in the corresponding row of the dummy line. Thereafter, the signal in the dummy line from that row is propagated along the length or the column of the RAM/ROM array until the signal in the dummy line reaches an output buffer trigger causing it to trigger the output buffer. The signals from the particular word line are propagated along the columns and are gated into the output buffer upon receipt of a signal from the output buffer trigger.

SUMMARY OF THE INVENTION

In the present invention, a synchronous integrated circuit is disclosed which has a two dimensional array of interconnected gates. The array receives a plurality of input signals along a first dimension thereof and produces a plurality of output signals along a second dimension thereof. The first array of logic gates is constructed from a plurality of transistors connected along the first dimension and a plurality of transistors connected along the second dimension. A first delay line has a first end and a second end and has a plurality of interconnected single transistors connected in a line. The number of interconnected single transistors in the first delay line is equal to the largest number of transistors in the first array along the second dimension. A second delay line has a first end and a second end. The second delay line also has a plurality of interconnected single transistors connected in a line. The number of interconnected single transistors in the second delay line is equal to the largest number of transistors in the first array along the first dimension. The second end of the first delay line is connected to the first end of the second delay line. The circuit has means for receiving a clock signal. The circuit also comprises means for clocking the plurality of input signals simultaneously into the first array along the first dimension and simultaneously clocking a first dummy signal into the first delay line at the first end thereof based upon the clock signal. Finally, the circuit comprises means for outputting the output signals along the second dimension from the first array when the dummy signal reaches the second end of the second delay line.

DETAILED DESCRIPTION OF THE DRAWINGS

Figure 1:
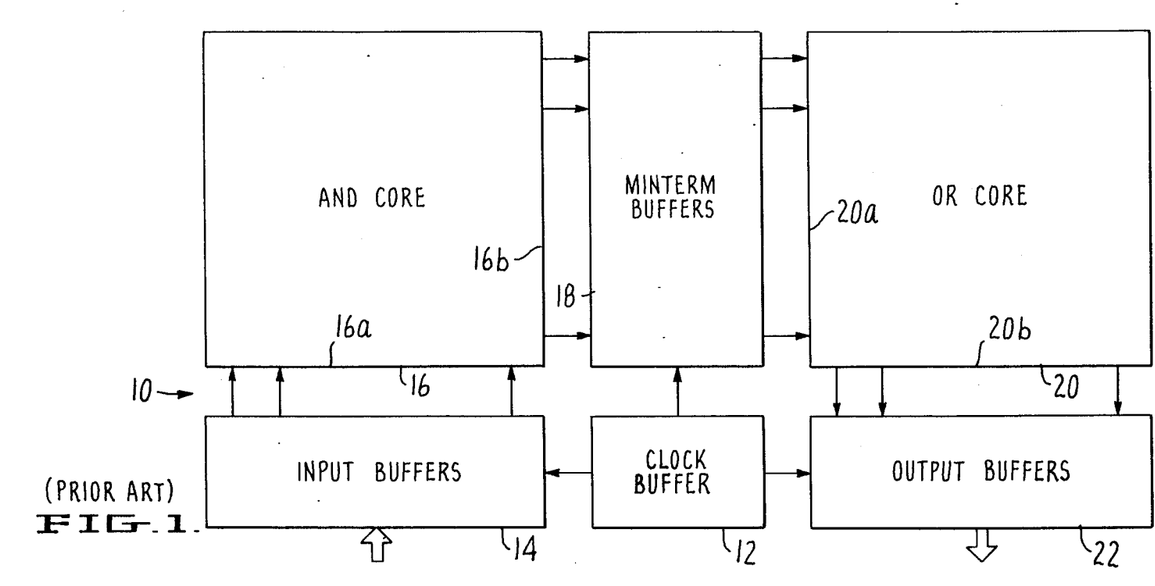
FIG. 1 is a schematic block diagram of a synchronous PLA circuit of the prior art.

Referring to FIG. 1, there is shown a synchronous PLA circuit 10 of the prior art. The synchronous PLA circuit 10 comprises a clock buffer 12 which is adapted to receive a clock signal. An input buffer 14 is adapted to receive a plurality of input signals and supplying the input signals to a first array 16, which comprises a plurality of AND gates. The input signals from the input buffer 14 are gated into the first array 16 upon the falling edge of a clock cycle from the clock buffer 12. The first array 16 is a two dimensional rectilinear array of logic gates. The first array 16 has a first dimension 16a and a second dimension 16b. The input signals are received simultaneously by the first array 16 along the first dimension 16a thereof. The input signals to the first array 16 are propagated through the plurality of AND gates in the first array 16 and the output is produced along the second dimension 16b thereof. The output signals are sent to a minterm buffer 18.

The minterm buffer 18 is adapted to receive the output signals from the first array 16 and to input them into the second array 20 upon the rising edge of a clock cycle from the clock buffer 12. The second array 20 is similar to the first array 16 in that it is a two dimensional rectilinear array of logic gates. However, the second array 20 has a plurality of OR gates. The second array 20 also has a first dimension 20a for receiving the input signals from the minterm buffer 18 and a second dimension 20b for providing the output signals to an output buffer 22. From the output buffer 22, the signals are provided as the output of the synchronous PLA circuit 10.

In the operation of the synchronous PLA circuit 10 of the prior art, the input signals are received by the input buffer 14 and are clocked into the AND array 16 upon the falling edge of a clock cycle supplied from the clock buffer 12. The input signals are all supplied simultaneously on the one dimension 16a of the AND array 16. However, as will be appreciated, the AND array 16 does not have as many gates in the one dimension 16a as in the second dimension 16b. Further, within either the first dimension 16a or the second dimension 16b, the number of transistors in each row or column, respectively, may vary. In short, there will be different number of gates through which each of the different input signals will pass. Since each of the input signals will pass through a different number of gates resulting in a different amount of delay, the output signals from the AND array 16 along the second dimension 16b thereof will not be simultaneously received by the minterm buffer 18. Thus, in the prior art, the clock cycle, the time between the falling edge, to clock the input signal into the AND array 16, and the rising edge, to clock the input signal into the OR array 20, has been calculated for the worst case. In short, the clock cycle is deliberately chosen to be the longest theoretical delay that an input signal passing through the AND array 16 would encounter.

A further problem with the prior art, as previously discussed, is that since the transistors of the minterm buffer 18 must switch state, due to the AND array 16 changing outputs, the current flow from the power lines must be high. Thus, the pitch of the power metal lines to the minterm buffer 18 must be wide. The outputs of the AND array 16 and OR array 20 evaluate states very slowly. This is due to typically very small transistors with slow output drive capability. the transistors are small to increase the array density. Finally, glitches can occur in the output of the minterm buffer 18 and of the output buffer 22, as, previously explained. Further, glitches cause an increase in power consumption.

Figure 2:
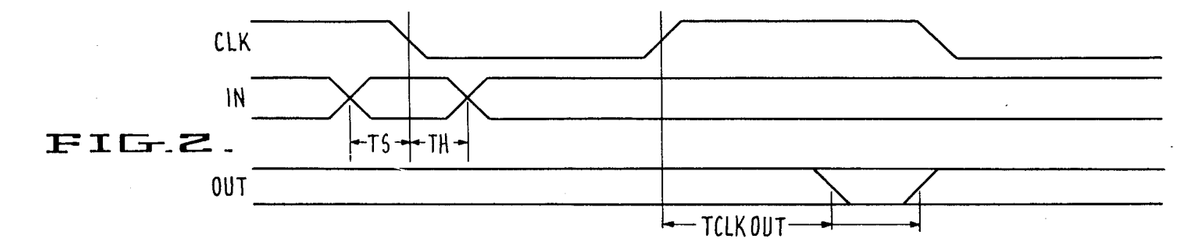
FIG. 2 is a timing diagram for the synchronous PLA of the prior art shown in FIG. 1.

Referring to FIG. 2, there is shown a timing diagram of the operation of the synchronous PLA circuit 10 of the prior art.

Figure 3:
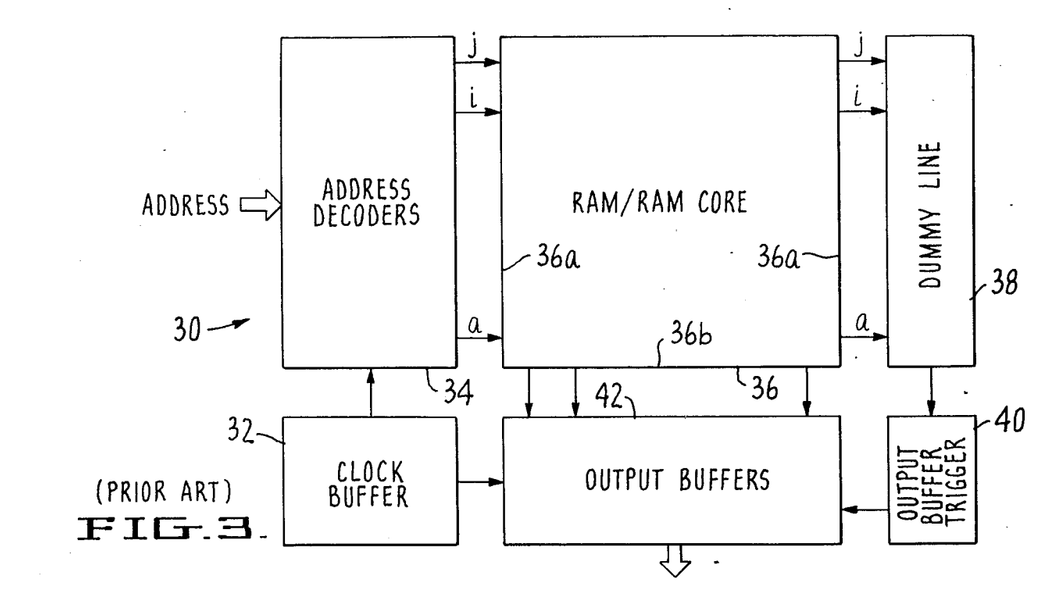
FIG. 3 is a schematic block diagram of a RAM/ROM array of the prior art.
Figure 4:
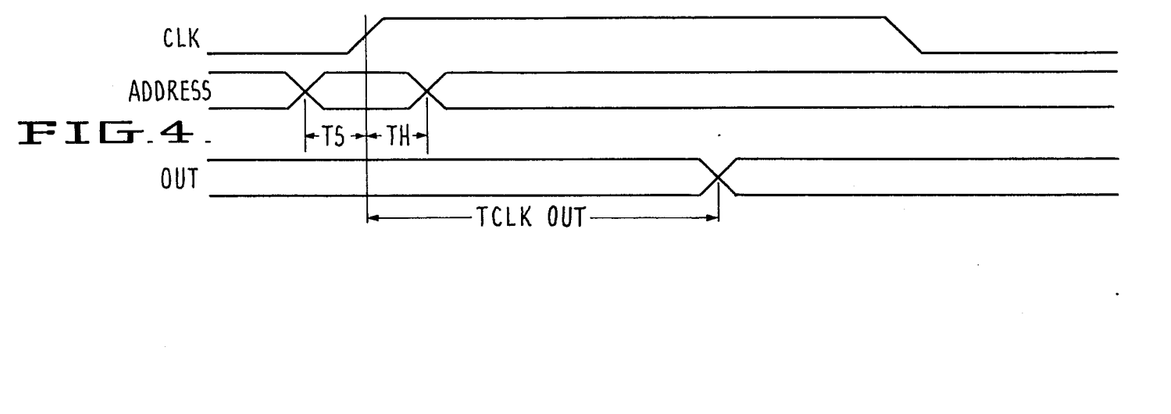
FIG. 4 is a timing diagram for the RAM/ROM array of the prior art shown in FIG. 3.

Referring to FIG. 3, there is shown a memory circuit 30 of the prior art. The memory circuit 30 comprises a clock buffer 32 adapted to receive a clock signal. The memory circuit 30 also comprises an address decoder 34 adapted to receive a plurality of address lines. The address decoder 34 receives the plurality of addresses from an address bus and outputs a single signal selecting a single line. Although a plurality of output lines are provided from the address decoder 34 (shown as lines A-J), when the address decoder 34 is activated, only a single line is activated. The address decoder 34 decodes the address lines supplied to it based upon the clock signal supplied from the clock buffer 32. From the address decoder 34, the output line selects a single row line of the RAM/ROM array 36. The RAM/ROM array 36 is a rectilinear array of memory cells. The memory array 36 has two dimensions: a first dimension 36a and a second dimension 36b. The plurality of select lines from the address decoder 34 are supplied to the memory array 36 along the first dimension 36a thereof. The output of the memory array 36 is outputted along the second dimension 36b of the memory array 36.

The plurality of select lines (A-J) from the address decoder 34 are also passed through the memory array 36 and are supplied to a dummy line 38. The dummy line 38 is a line comprising of a plurality of interconnected single transistors connected in a line. The dummy line 38 has as many transistors as there are select lines (A-J), irrespective of the number of transistors which the select lines are connected, in the memory array 36 along the first dimension 36a thereof. Thus, the number of transistors in the dummy line does not depend on the number of transistors on the array along either the first or second dimension. From the dummy line 38, the signal is supplied to an output buffer trigger 40. The output of the memory array 36 along the second dimension 36b thereof is supplied to the output buffer 42. The output buffer trigger 40 is also supplied to the output buffer 42 and triggers the gating of the output from the memory array 36 into the output buffer 42. The output buffer 42 provides the output of the memory circuit 30.

In the operation of the memory circuit 30, when a plurality of address lines is received by the address decoder 34, upon the presence of a clock signal 32 on the rising edge thereof, the address decoder 34 decodes the address supplied to it and selects a single line along the output select line (A-J). The signal propagates along the single selected output line into the memory array 36 in the direction of the second dimension 36b thereof and also into the dummy line 38. Thereafter, the signals in the memory array 36 on that selected row are propagated in the direction of the first dimension 36a into the output buffer 42. At the same time, the signal in the dummy line 38 is propagated in the direction of the first dimension 36a into the output buffer trigger 40. When the signal has reached the output buffer trigger 40, it triggers the output buffer 42 to evaluate the signal received from the memory array 36.

In memory circuit applications, each bit or column of a memory array 36 is evaluated by a sense amplifier to detect the differential current flowing therein. Further, since it is highly desirable to pack the memory array 36 as densely as possible, the amount of current present on each of the column or bit lines from the memory array 36 into the output buffer 42 is very small. Thus, it is hard to detect when to commence the evaluation of the sense amplifier for the differential current. The dummy line 38 provides a plurality of interconnected single transistors with each transistor bigger than the transistors in the memory array 36. This gives a stronger signal than the signal from the memory array 36. A stronger signal from the dummy line 38 is propagated to the output buffer trigger 40 which triggers the output buffer 42 to commence the evaluation of the differential current on the output line received by the output buffer 42 from the memory array 36. Thus, the function of the dummy line 38 is to provide a larger signal to signal the commencement of the evaluation phase of the signal from the memory array 36.

Figure 5:
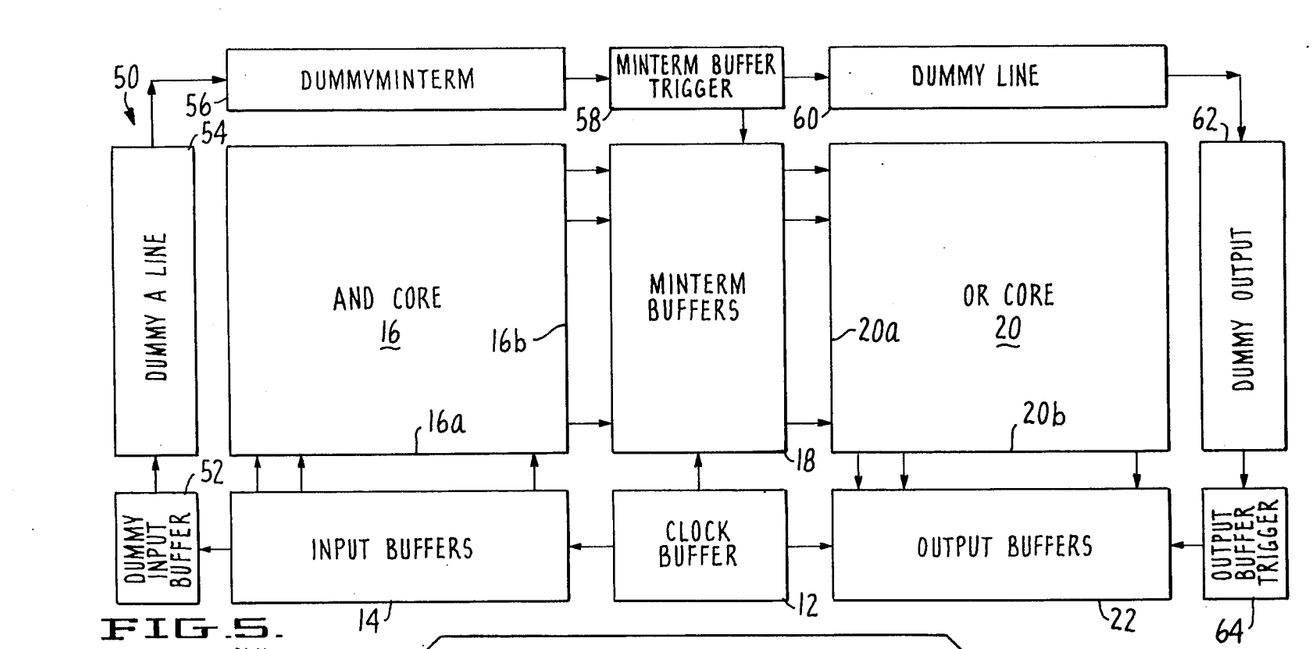
FIG. 5 is a schematic block diagram of an improved synchronous PLA circuit of the present invention.

Referring to FIG. 5, there is shown an improved synchronous PLA circuit 50 of the present invention. The synchronous PLA circuit 50 comprises a clock buffer 12 to receive a clock signal. From the clock buffer 12, the clock signal is supplied to an input buffer 14. The clock signal from the clock buffer 12 gates the input signals from the input buffer 14 into a first array 16 of logic gates. The first array 16 of logic gates can be, for example, AND gates. Similar to the prior art, the first array 16 of logic gates is a two dimensional array comprising of a plurality of transistors in the first dimension 16a and a plurality of transistors in the second dimension 16b. The input signals from the input buffer 14 are supplied simultaneously to the first array 16 along the first dimension 16a thereof.

The clock signal from the clock buffer 12 is also supplied to a dummy input buffer 52. When the clock signal is received by the dummy input buffer 52, a first dummy signal is generated. The first dummy signal is supplied to a first delay line 54. The first delay line 54 is a plurality of interconnected single transistors connected in a line having a first end and a second end. The first dummy signal from the dummy input buffer 52 is supplied to the first delay line at the first end thereof. Thus, when the clock signal from the clock buffer 12 is sent to the input buffer 14 and the dummy buffer 52, the input signals and a first dummy signal are supplied simultaneously to the first array 16 and the first delay line 54, respectively.

Figure 7:
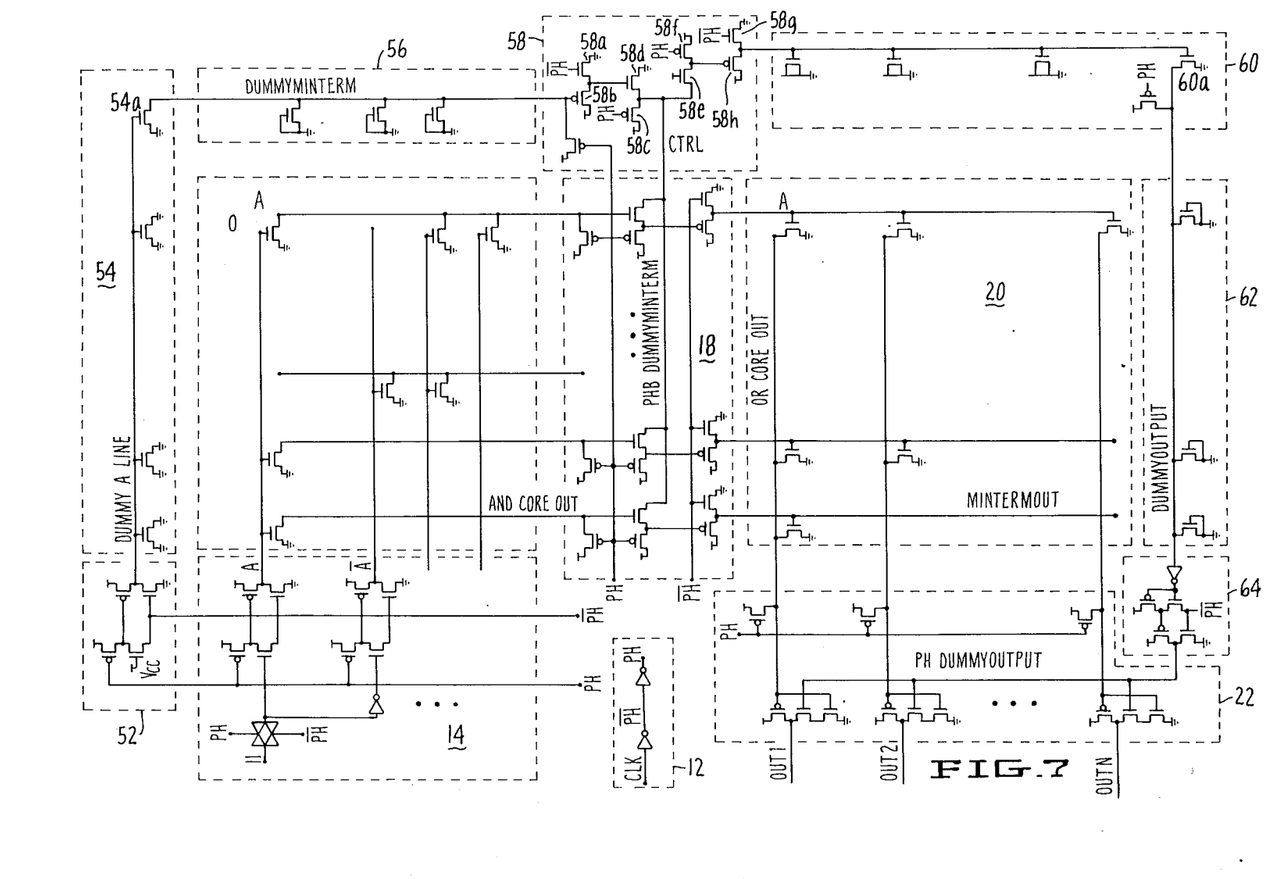
FIG. 7 is a circuit diagram of an example of an improved synchronous PLA circuit of the present invention.

The number of interconnected single transistors in the first delay line 54 is equal to the largest number of transistors in the first array 16 that are connected in a single column along the second dimension 16b. Thus, referring to FIG. 7, it can be seen that along the second dimension 16b, there are four columns of transistors. The first column, labeled A, has the largest number of transistors, or three transistors. Consequently, the first delay line 54 has three transistors. As shown in FIG. 7, each of the transistors in the first delay line 54 is of the MOS type whose gates are all connected together and whose source and drains are connected to ground. At the second end of the first delay line 54, the first dummy signal is supplied to a first transition transistor 54a. The first transition transistor 54a is also another MOS FET type transistor whose gate is connected to the first delay line 54 and whose source is connected to ground and whose drain is connected to a second delay line 56.

This second delay line 56 also has a plurality of interconnected single transistors which are connected in a line, having a first end and a second end. The drain of the first transition transistor 54a is connected to the first end of the second delay line 56. The number of interconnected single transistors in the second delay line 56 is equal to the largest number of transistors in the first array 16 that are connected in a single row along the first dimension 16a. Thus, referring to FIG. 7, it can be seen that along the first dimension 16a, there are four rows of transistors. the top row labeled "O," in FIG. 7 has the largest number of transistors. The second delay line, accordingly, has only three transistors, as many transistors as in row O.

The transistors in the second delay line 56 are connected such that each transistor has its gate connected to the source which is connected to ground. The drain of the all the transistors are connected together.

The output signals of the first array 16 along the second dimension 16b thereof are supplied to a minterm buffer 18. The first dummy signal from the second delay line 56 is supplied to a minterm buffer trigger 58. The minterm buffer trigger 58 functions to gate the output signals from the first array 16 into the minterm buffer 18 and to provide as input signals to the second array 20 along its first dimension 20a thereof. In addition, the minterm buffer trigger 58 generates a second dummy signal which is supplied to a first end of a third dummy line 60. Each of these functions will be described in greater detail hereinafter.

The second array 20 is another two dimensional array of logic gates, such as OR gates. The input signals supplied to the second array 20 along the first dimension thereof 20a pass through the array of logic gates and are outputted from the second array 20 along the second dimension 20b thereof. Similar to the first array 16, the second array 20 comprises a plurality of transistors connected along the first dimension 20a and a plurality of transistors connected along the second dimension 20b. The third delay line 60 is similar to the first delay line 54. The third delay line comprises a plurality of interconnected single transistors that are connected in a line having a first end and a second end. The second dummy signal generated by the minterm buffer trigger 58 is supplied to the first end of the third delay line 60. The number of interconnected single transistors in this third delay line 60 is equal to the largest number of transistors in the second array 20 along the second dimension 20b. Thus, as can be seen in FIG. 7, the second array 20 has three transistors in the row labeled "A." Therefore, the third delay line 60 has three interconnected single transistors. Each of the interconnected single transistors of the third delay line 60 is similar to the transistors in the first delay line 54. The gates of all the transistors are connected together and the source and drain of the transistors are connected to ground potential. At the second end of the third delay line 60, the second dummy signal is supplied to a second transition transistor 60a. The second dummy signal is supplied to the gate of the second transition transistor 60a, whose source is connected to ground potential and whose drain is connected to a first end of the fourth delay line 62.

The fourth delay line 62, similar to the second delay line 56, also has a plurality of interconnected single transistors that are connected in a line having a first end and a second end. The number of interconnected single transistors in the fourth delay line is equal to the largest number of transistors in the second array 20 that are connected in a single column along the first dimension 20a. As, can be seen in FIG. 7 for the example shown therein, the second array 20 has three connected transistors in the column "OR_CORE_OUT". Thus, the fourth delay line comprises three interconnected single transistors whose drains are all connected together and whose gates are connected to the source which is connected to ground potential. The output of the second dummy signal from the fourth delay line 62 is supplied to an output buffer trigger 64.

The output signals of the second array 20 are supplied to an output buffer 22 along the second dimension 20b thereof. The output buffer trigger 64 produces a signal which gates the output signal from the second array 20 into the output buffer 22. From the output buffer 22, the signals are supplied as the output of the PLA circuit 50.

Figure 6:
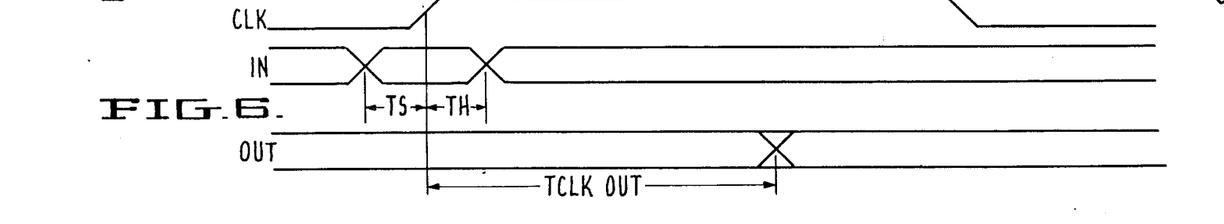
FIG. 6 is a timing diagram of the operation of the improved synchronous PLA circuit of the present invention as shown in FIG. 5.

Referring to FIG. 6, there is shown a timing diagram of the various signals used in the PLA circuit 50 of the present invention. As can be seen from the timing diagram, unlike the prior art PLA circuit 10, the PLA circuit 50 of the present invention is responsive to a single clock cycle. On the rising edge of the clock cycle, the input is clocked into the PLA circuit 50. The output is supplied from the output buffer 22 with a delay, shown as TCLK-OUT in FIG. 6, from the rising edge of the clock. The value of the delay depends on the array dimensions for arrays 16 and 20, and the maximum number of transistors for each respective array in their respective dimensions. The greater the number of transistors in each respective dimension of each respective array 16 and 20, the greater the value of this delay. Further, as previously discussed, there are no output glitches associated with the PLA circuit 50 of the present invention. In addition, the power lines to the minterm buffer 18 and the output buffer 22 are minimized.

Referring to FIG. 7, there is shown a schematic circuit diagram of an example of a PLA circuit 50 of the present invention. The operation of the PLA circuit 50 will now be described with respect to the example shown in FIG. 7.

The clock signal CLK is supplied to the clock buffer 12 which produces an inverted clock signal $\overline{PH}$ and a non-inverted clock signal PH. The clock signals $\overline{PH}$ and the PH are used throughout the PLA circuit 50. When the clock signal PH is low, the clock signal $\overline{PH}$ will be high. This would be the condition prior to the data being received by the PLA circuit 50. During this time, the clock signal $\overline{PH}$, supplied to the input driver 14, prevents any signal from being supplied to the first array 16. This can be seen by referring to FIG. 8, which shows a portion of the input buffer 14.

Figure 8:
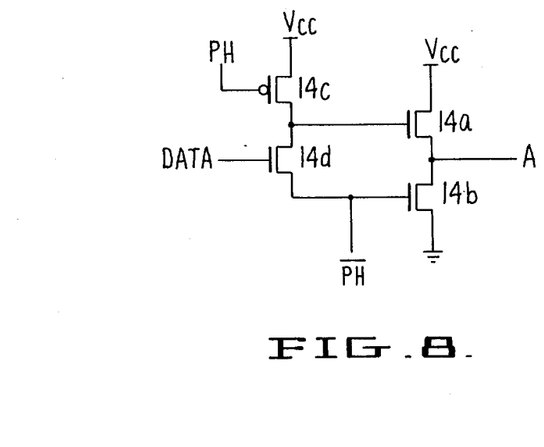
FIG. 8 is a circuit diagram of a portion of the circuit shown in FIG. 7.

The portion of the input buffer 14 shown in FIG. 8 shows four transistors: 14a, 14b, 14c and 14d. These transistors along with the clock signals PH and $\overline{PH}$ are used to control the gating of the data signal into the first array 16. When the clock signal PH is low, transistor 14c is on. This, however, will cause transistor 14a to be off. The clock signal $\overline{PH}$ will cause transistor 14b to turn on. This causes a low voltage or ground potential to be supplied at the input A to the first array 16.

The clock signal PH and $\overline{PH}$ are also supplied to the minterm buffer 18. During the time when the clock signal PH is low and the clock signal $\overline{PH}$ is high, this is known as the precharge time period. During the precharge time period, $V_{CC}$ would be applied to the output lines, shown as O of FIG. 9, of the first and second arrays 16 and 20 respectively. Thus, all of the transistors in the first array 16 will have their drain precharged to $V_{CC}$. The second delay line is also precharged to $V_{CC}$.

Figure 9:
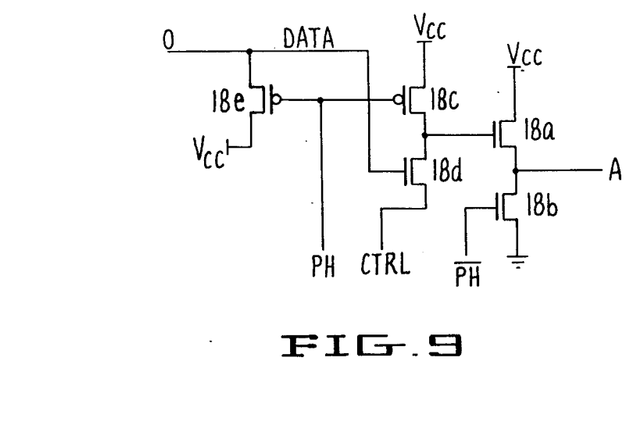
FIG. 9 is a circuit diagram of a portion of the circuit shown in FIG. 7.

As can be seen in FIG. 9, a second portion of the minterm buffer 18 is the gating of the output data from the first array 16 into the second array 20. Similar to that which was described for the action of the input of the signal to the first array 16, when the clock signal $\overline{PH}$ is high, transistor 18a is off, transistor 18b is on and transistor 18c is on. Thus, no signal is impressed on the input line A to the second array 20.

Similarly, during the precharge phase, the clock signal PH is also supplied to the output buffer 22 which causes the output lines of the second array 20 to be precharged to $V_{CC}$. The fourth delay line 62 is also precharged to $V_{CC}$.

When the clock signal PH goes high, the data in the input buffer 14 is clocked into the first array 16. This action may be seen by referring to FIG. 8. When the clock signal PH is high, transistor 14c will be turned off. Conversely, the clock signal $\overline{PH}$ will be low which will turn off transistor 14b. If the data in the input buffer 14 is high, this will turn on transistor 14d which will turn on transistor 14a bringing the input line A to high. If the data in the input buffer 14 is low, this turns off transistor 14d which keeps transistor 14a turned off. Thus, the input line A to the first array 16 remains low.

Similarly, when the clock signal PH goes high, the precharge transistor 18e in the minterm buffer 18 will be turned off. The data on the output line 0 will be supplied directly to transistor 18d. Transistor 18c will also be turned off, as well as transistor 18b being turned off. When CTRL, the control signal from the minterm buffer trigger 58 is enabled, i.e. goes low, the data from the first array 16 will then affect transistor 18d and transistor 18a and be supplied as the input to the second array 20.

The dummy input buffer 52 is identical to the circuit shown in FIG. 8 except that the data line is connected to $V_{CC}$. Thus, when the clock signal PH goes high, a high signal $V_{CC}$ will be sent to the first delay line 54. The first dummy signal $V_{CC}$ is sent along the first delay line 54 and at each transistor thereof, representing the largest capacitive loading.

The first dummy signal reaches the first transition transistor 54a at the same time but no sooner than the longest signal propagating through the second dimension 16b of the first array 16. The first transition transistor 54a causes the signal $V_{SS}$ or GND to be sent into the second delay line 56. The first dummy signal reaches the end of the second delay line 56 at the same time but no sooner than the longest signal propagating through the first dimension 16a of the first array 16.

When the first dummy signal reaches the minterm buffer trigger 58, it turns on transistor 58b. This turns on transistor 58d which causes the control signal CTRL to go low. As previously discussed, when the control signal CTRL goes low, the output from the second array 16 is then gated into the minterm buffer 18 and is then supplied as input signal to the second array 20. In addition, within the minterm buffer trigger 58, when the control signal CTRL goes low, it causes transistor 58e and 58h to turn on. This generates a second dummy signal which is sent into the third delay line 60 at the same time that the minterm buffer output signals are sent to the second array 20.

When the second dummy signal reaches the end of the third delay line 60, the second transition transistor 60a causes the second dummy signal to be sent to the fourth delay line 62. The second dummy signal reaches the end of the third delay line 60 at the same time but no sooner than the longest propagating signal through the second dimension 20b of the second array 20. When the second dummy signal reaches the end of the fourth delay line 62, this causes the output buffer trigger 64 to gate the output signals from the second array 20 into the output buffer 22 and is supplied as the output to the PLA circuit 50 The second dummy signal reaches the end of the fourth delay line at the same time but no sooner than the longest propagating signal through the first dimension 20a of the second array 20.

In the operation of the PLA circuit 50 of the present invention, since the first delay line 54 has as many transistors as there are in the second dimension 16b, the first dummy signal will reach the second end of the first delay line 54 in the same time as the worst case of the input signal supplied to the first array 16 reaching the last transistor in the direction of the second dimension 16b. Thus, the first delay line 54 is calculated for a period of delay which is the maximum delay experienced by input signals supplied into the first array 16. Similarly, the first dummy signal propagating through the second delay line 56 will experience the maximum delay that a signal in the first array 16 would encounter in propagating through the first array 16 in the first dimension 16a direction. Thus, when the first dummy signal reaches the minterm buffer trigger 58, and the control signal CTRL is generated, all the signals from the first array 16 would have arrived at their respective outputs. The control signal CTRL can then gate all of the output signals into the second array 20. The operation of the third delay line 60 and the fourth delay line 62 with respect to the second array 20 is identical to the operation described for the first and second delay lines 54 and 56 in connection with the first array 16.

There are many advantages to the PLA circuit 50 of the present invention. First and foremost is that the circuit 50 is responsive to a single clock cycle. Thus, the designer using the circuit 50 needs to be concerned with providing only a single clock cycle. The circuit 50 will automatically provide the output when all of the signals are present on the output pins. Secondly, because each of the delay lines is calculated to provide only the maximum or worst case delay, the delay of the overall circuit 50 is matched to exactly what the worst case signal delay propagation would be. Thirdly, because the minterm buffer 18 and output buffer 22 are turned on or enabled after the output signals of the first array 16 and second array 20 have reached the minterm buffer 18 and output buffer 22, respectively, glitches are eliminated in the PLA circuit 50 of the present invention. Finally, since glitches are eliminated, unnecessary power transients are eliminated, and power lines to the minterm buffer 18 and the output buffer 22 are greatly reduced.

What is claimed is:

1. A synchronous integrated circuit comprising:
   a first two dimensional array of interconnected logic gates; said first array for receiving a plurality of input signals along a first dimension thereof and for producing a plurality of output signals along a second dimension thereof;
   said first array of logic gates being constructed from a plurality of transistors connected along said first dimension and a plurality of transistors connected along said second dimension;
   a first delay line having a first end and a second end and having a plurality of interconnected single transistors connected in a line; the number of interconnected single transistors in said first delay line is equal to the largest number of connected transistors in said first array along said second dimension;
   a second delay line having a first end and a second end and having a plurality of interconnected single transistors connected in a line; the number of interconnected single transistors in said second delay line is equal to the largest number of connected transistors in said first array along said first dimension;
   said second end of said first delay line is connected to the first end of said second delay line;
   means for receiving a clock signal;
   means for clocking said plurality of input signals simultaneously into said first array along said first dimension, and simultaneously for clocking a first dummy signal into said first delay line at first end thereof based upon said clock signal; and
   means, coupled to said second end of said second delay line, for outputting said output signals along said second dimension from said first array when said first dummy signal reaches said second end of said second delay line.

2. The circuit of claim 1 further comprising
   a second two dimensional array of interconnected logic gates; said second array for receiving a plurality of input signals along a first dimension thereof and for producing a plurality of output signals along a second dimension thereof;
   said second array of logic gates being constructed from a plurality of transistors connected along said first dimension and a plurality of transistors connected along said second dimension;
   a third delay line having a first end and a second end and having a plurality of interconnected single transistors connected in a line; the number of interconnected single transistors in said third delay line is equal to the largest number of connected transistors in said second array along said second dimension;
   a fourth delay line having a first end and a second end and having a plurality of interconnected single transistors connected in a line; the number of interconnected single transistors in said fourth delay line is equal to the largest number of connected transistors in said second array along said first dimension;
   said second end of said third delay line is connected to the first end of said fourth delay line;
   said output signals along said second dimension from said first array are connected to the second array along said first dimension thereof as input signals thereto;
   means for generating a second dummy signal in said third delay line at first end thereof in response to the first dummy signal reaching said second end of said second delay line; and
   means, coupled to said second end of said fourth delay line, for outputting said output signals from said second array when said second dummy signal reaches said second end of said fourth delay line.

3. The circuit of claim 2 wherein said first array comprises an array of interconnected AND gates.

4. The circuit of claim 2 wherein said second array comprises an array of interconnected OR gates.

5. In an improved synchronous integrated circuit of the type having a first two dimensional array of interconnected logic gates, said first array for receiving a plurality of input signals along a first dimension thereof and for producing a plurality of output signals along a second dimension thereof; said first array of logic gates being constructed from a plurality of transistors connected along said first dimension and a plurality of transistors connected along said second dimension; means for receiving a clock signal and means for clocking said plurality of input signals simultaneously into said first array along said first dimension based upon said clock signal, wherein the improvement comprises:

a first delay line having a first end and a second end and having a plurality of interconnected single transistors connected in a line; the number of interconnected single transistors in said first delay line is equal to the largest number of connected transistors in said first array along said second dimension;

a second delay line having a first end and a second end and having a plurality of interconnected single transistors connected in a line; the number of interconnected single transistors in said second delay line is equal to the largest number of connected transistors in said first array along said first dimension;

said second end of said first delay line is connected to the first end of said second delay line;

means for clocking a first dummy signal into said first delay line at first end thereof simultaneously with the clocking of said plurality of input signals into said first array; and means, coupled to said second end of said second delay line, for outputting said output signals along said second dimension from said first array when said first dummy signal reaches said second end of said second delay line.

6. The circuit of claim 5 further comprising a second two dimensional array of interconnected logic gates; said second array for receiving a plurality of input signals along a first dimension thereof and for producing a plurality of output signals along a second dimension thereof;

said second array of logic gates being constructed from a plurality of transistors connected along said first dimension and a plurality of transistors connected along said second dimension;

a third delay line having a first end and a second end and having a plurality of interconnected single transistors connected in a line; the number of interconnected single transistors in said third delay line is equal to the largest number of connected transistors in said second array along said second dimension;

a fourth delay line having a first end and a second end and having a plurality of interconnected single transistors connected in a line; the number of interconnected single transistors in said fourth delay line is equal to the largest number of connected transistors in said second array along said first dimension;

said second end of said third delay line is connected to the first end of said fourth delay line;

said output signals along said second dimension from said first array are connected to the second array along said first dimension thereof as input signals thereto;

means for generating a second dummy signal in said third delay line at first end thereof in response to the first dummy signal reaching said second end of said second delay line; and means, coupled to said second end of said fourth delay line, for outputting said output siqnals from said second array when said second dummy signal reaches said second end of said fourth delay line.

7. The circuit of claim 6 wherein said first array comprises an array of interconnected AND gates.

8. The circuit of claim 6 wherein said second array comprises an array of interconnected OR gates.

9. A synchronous integrated circuit responsive to a single clock cycle having a beginning and an end, said circuit comprising:

a first two dimensional array of interconnected logic gates; said first array for receiving a plurality of input signals along a first dimension thereof and for producing a plurality of output signals along a second dimension thereof;

said first array of logic gates being constructed from a plurality of transistors connected along said first dimension and a plurality of transistors connected along said second dimension;

a first delay line having a first end and a second end and having a plurality of interconnected single transistors connected in a line; the number of interconnected single transistors in said first delay line is equal to the largest number of connected transistors in said first array along said second dimension;

a second delay line having a first end and a second end and having a plurality of interconnected single transistors connected in a line; the number of interconnected single transistors in said second delay line is equal to the largest number of connected transistors in said first array along said first dimension;

said second end of said first delay line is connected to the first end of said second delay line;

means for receiving said clock cycle;

means for clocking said plurality of input signals simultaneously into said first array along said first dimension, and simultaneously for clocking a first dummy signal into said first delay line at first end thereof at substantially the beginning of said clock cycle;

means, coupled to said second end of said second delay line, for outputting said output signals along said second dimension from said first array when said first dummy signal reaches said second end of said second delay line;

a second two dimensional array of interconnected logic gates; said second array for receiving a plurality of input signals along a first dimension thereof and for producing a plurality of output signals along a second dimension thereof;

said output signals along said second dimension from said first array are connected to the second array along said first dimension thereof as input signals thereto;

said second array of logic gates being constructed from a plurality of transistors connected along said first dimension and a plurality of transistors connected along said second dimension:

a third delay line having a first end and a second end and having a plurality of interconnected single transistors connected in a line; the number of interconnected single transistors in said third delay line is equal to the largest number of connected transistors in said second array along said second dimension;

a fourth delay line having a first end and a second end and having a plurality of interconnected single transistors connected in a line; the number of interconnected single transistors in said fourth delay line is equal to the largest number of connected transistors in said second array along said first dimension;

said second end of said third delay line is connected to the first end of said fourth delay line;

said output signals along said second dimension from said first array are connected to the second array along said first dimension thereof as input signals thereto;

means for generating a second dummy signal in said third delay line at first end thereof in response to the first dummy signal reaching said second end of said second delay line; and means, coupled to said second end of said fourth delay line, for outputting said output signals from said second array when said second dummy signal reaches said second end of said fourth delay line.

10. The circuit of claim 9 wherein said first array comprises an array of interconnected AND gates.

11. The circuit of claim 9 wherein said second array comprises an array of interconnected OR gates.

* * * * *